United States Patent
Lee et al.

(10) Patent No.: US 10,121,698 B2
(45) Date of Patent: *Nov. 6, 2018

(54) METHOD OF MANUFACTURING A SEMICONDUCTOR DEVICE

(71) Applicant: Taiwan Semiconductor Manufacturing Company, Ltd., Hsin-Chu (TW)

(72) Inventors: Hsiang-Huan Lee, Jhudong Township (TW); Shau-Lin Shue, Hsin-Chu (TW); Kuang-Kuo Koai, Zhubei (TW); Hai-Ching Chen, Hsin-Chu (TW); Tung-Ching Tseng, Taipei (TW); Wen-Cheng Yang, Hsin-Chu (TW); Chung-En Kao, Toufen Township (TW); Ming-Han Lee, Taipei (TW); Hsin-Yen Huang, New Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/407,145

(22) Filed: Jan. 16, 2017

(65) Prior Publication Data

US 2017/0125290 A1    May 4, 2017

Related U.S. Application Data

(63) Continuation of application No. 15/056,872, filed on Feb. 29, 2016, now Pat. No. 9,548,241, which is a
(Continued)

(51) Int. Cl.
   *H01L 21/768*    (2006.01)
   *H01L 21/02*    (2006.01)
   (Continued)

(52) U.S. Cl.
   CPC .... *H01L 21/76846* (2013.01); *H01L 21/0206* (2013.01); *H01L 21/02057* (2013.01);
(Continued)

(58) Field of Classification Search
   CPC ......... H01L 21/31695; H01L 21/76801; H01L 21/312; H01L 21/7682; H01L 23/5329
   See application file for complete search history.

(56) References Cited

U.S. PATENT DOCUMENTS 6,403,466 B1    6/2002    Lopatin
6,451,712 B1    9/2002    Dalton et al.
(Continued)

FOREIGN PATENT DOCUMENTS

CN    1427456 A    7/2003
CN    101171367 A    4/2008
(Continued)

*Primary Examiner* — Quoc Hoang
(74) *Attorney, Agent, or Firm* — Slater Matsil, LLP

(57) ABSTRACT

Semiconductor device metallization systems and methods are disclosed. In some embodiments, a metallization system for semiconductor devices includes a mainframe, and a plurality of modules disposed proximate the mainframe. One of the plurality of modules comprises a physical vapor deposition (PVD) module and one of the plurality of modules comprises an ultraviolet light (UV) cure module.

20 Claims, 4 Drawing Sheets

Related U.S. Application Data continuation of application No. 14/153,738, filed on Jan. 13, 2014, now Pat. No. 9,318,364.

(51) Int. Cl.
*H01L 21/306* (2006.01)
*H01L 21/677* (2006.01)
*H01L 21/67* (2006.01)
*H01L 21/285* (2006.01)
*H01L 21/321* (2006.01)
*H01L 21/3105* (2006.01)

(52) U.S. Cl.
CPC .. *H01L 21/02063* (2013.01); *H01L 21/02631* (2013.01); *H01L 21/2855* (2013.01); *H01L 21/30604* (2013.01); *H01L 21/3105* (2013.01); *H01L 21/3212* (2013.01); *H01L 21/677* (2013.01); *H01L 21/67184* (2013.01); *H01L 21/67207* (2013.01); *H01L 21/67742* (2013.01); *H01L 21/7684* (2013.01); *H01L 21/76802* (2013.01); *H01L 21/76828* (2013.01); *H01L 21/76871* (2013.01); *H01L 21/76877* (2013.01)

(56) References Cited

U.S. PATENT DOCUMENTS

| | | | |
|---|---|---|---|
| 6,972,254 | B1 | 12/2005 | Lopatin et al. |
| 7,663,121 | B2 | 2/2010 | Nowak et al. |
| 8,492,170 | B2 | 7/2013 | Xie et al. |
| 8,993,444 | B2 | 3/2015 | Chan et al. |
| 9,224,593 | B2 * | 12/2015 | Ahn ............... C23C 16/401 |
| 9,318,364 | B2 * | 4/2016 | Lee ............... H01L 21/677 |
| 2009/0162259 | A1 | 6/2009 | Nowak et al. |
| 2011/0160900 | A1 | 6/2011 | Morita |

FOREIGN PATENT DOCUMENTS

| | | |
|---|---|---|
| CN | 102931135 A | 2/2013 |
| CN | 103430291 A | 12/2013 |

* cited by examiner

METHOD OF MANUFACTURING A SEMICONDUCTOR DEVICE

PRIORITY CLAIM

This application is a continuation of U.S. patent application Ser. No. 15/056,872, filed Feb. 29, 2016, and entitled "Semiconductor Device Metallization Systems and Methods," which application claims priority to as a continuation of U.S. patent application Ser. No. 14/153,738, filed Jan. 13, 2014, now U.S. Pat. No. 9,318,364 issued on Apr. 19, 2016, and entitled "Semiconductor Device Metallization Systems and Methods," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, in other types of packaging, or used directly in an end application, for example.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (K) materials that have dielectric constants less than a dielectric constant of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to processing systems and methods for semiconductor devices. Novel metallization systems and methods will be described herein wherein a UV cure module is included in the metallization systems and improves the results of various processes performed in the metallization systems.

Figure 1:
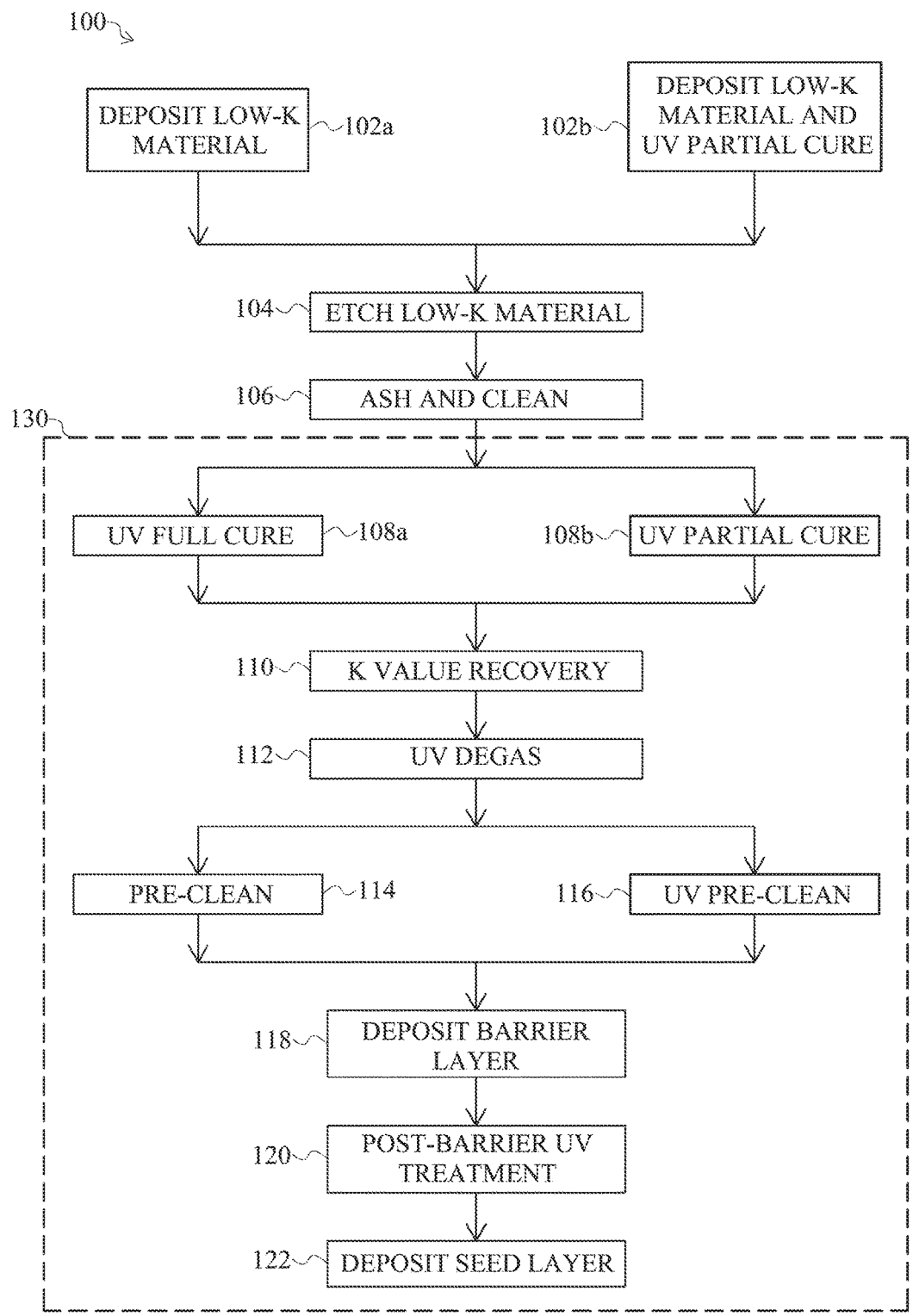
FIG. 1 is a flow chart of a method of processing a semiconductor device in accordance with some embodiments of the present disclosure.

FIG. 1 is a flow chart 100 of a method of processing a semiconductor device (see semiconductor device 162 shown in FIGS. 3 through 6) in accordance with some embodiments of the present disclosure. First, the semiconductor device is provided which includes a workpiece (see workpiece 170 shown in FIG. 4). The semiconductor device is in wafer form before singulation (see wafer 160 shown in FIG. 3), which will be described further herein. Either step 102a or step 102b of the flow chart 100 shown in FIG. 1 is then performed.

In step 102a, a low-K material (see low-K material 172 shown in FIG. 4) is deposited on the semiconductor device, e.g., over the workpiece. The low-K material has a dielectric constant or K value of less than a dielectric constant of $SiO_2$, which is about 3.9, in some embodiments.

In step 102b, the low-K material is deposited on the semiconductor device, and a UV partial cure is performed. Some low-K materials are porous and/or somewhat soft, and require curing after deposition, for example. Curing low-K materials removes porogens from and lowers a bulk K value of the low-K materials in some applications, for example. In step 102b, the low-K material is partially, but not fully, cured using the UV partial cure process. The UV partial cure comprises exposing the semiconductor device to UV light using a UV light source, in predetermined conditions for temperature, pressure, and ambient, for example. The low-K material is partially cured after depositing the low-K material in step 102b, for example.

Steps 102a and 102b are performed in a first tool in accordance with some embodiments. The low-K material is deposited using chemical vapor deposition (CVD) or other methods. The first tool may comprise a CVD tool, for example.

After either step 102a or 102b is performed, the low-K material is etched in step 104. The low-K material is etched using an etch process and an etch chemistry in a second tool in some embodiments. The second tool comprises an etch tool and comprises a different tool than the first tool in some embodiments. Note that between steps 102a or 102b and step 104, other steps may be performed, such as depositing a layer of photoresist on the low-K material, patterning the layer of photoresist with a desired pattern for the low-K material using a lithography process, and developing the layer of photoresist. Portions of the layer of photoresist are then ashed or etched away, and the other portions that are left remaining over the low-K material function as an etch mask during the etch process in step 104.

During the etch step 104, the pattern in the layer of photoresist is transferred to the low-K material, forming the pattern in the low-K material. In some embodiments, the pattern comprises a pattern for a plurality of conductive features that will be formed in the low-K material, e.g., using a damascene process or dual damascene process.

In step 106, which is an ash and clean step, an ash process is performed to remove the layer of photoresist, and a cleaning process is performed to remove debris from the lithography and etch processes and to remove any photoresist that may be left remaining. Step 106 is performed in a third tool in some embodiments. The third tool comprises a cleaning tool and is different than the first tool and second tool in some embodiments, for example.

Figure 2:
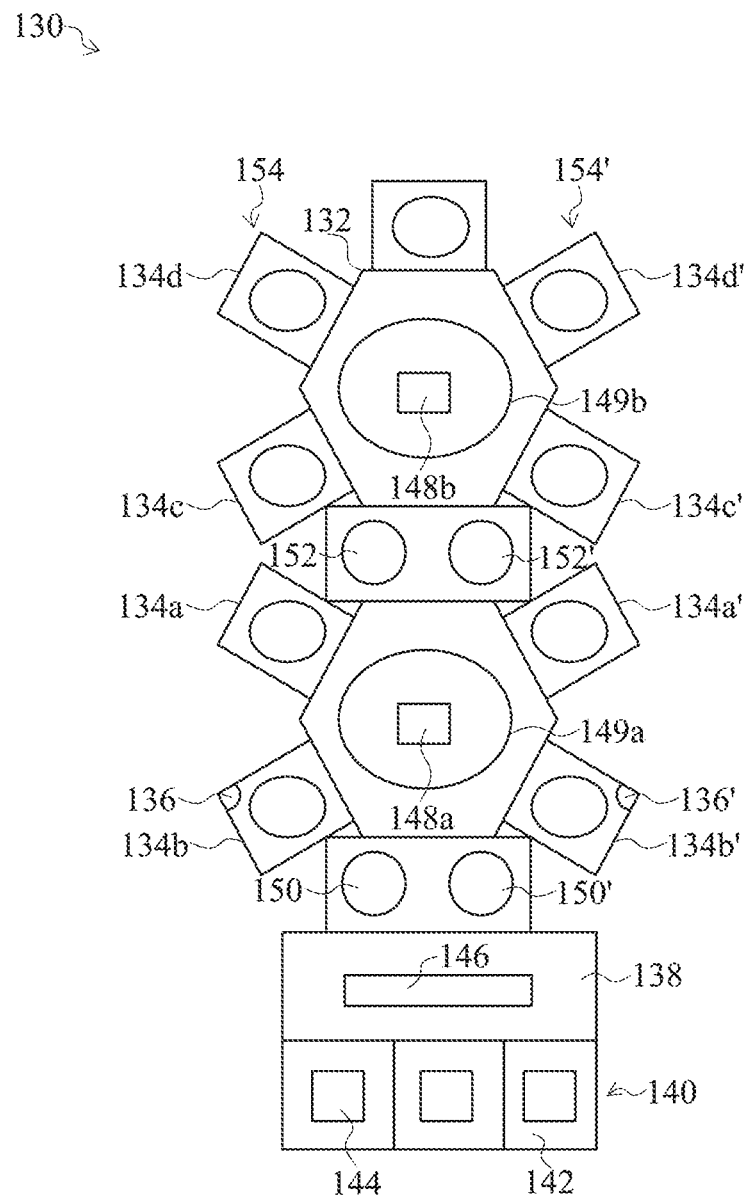
FIG. 2 is a block diagram of a metallization system for a semiconductor device that includes an ultraviolet light (UV) cure module in accordance with some embodiments.

The remaining steps in the flow chart 100 are then performed in a fourth tool, for which a block diagram is shown in FIG. 2. The remaining steps in the flow chart 100 (e.g., steps 108*a* or 108*b*, 110, 112, 114 or 116, 118, 120, and/or 122) are performed to form conductive features and/or patterns in the low K material in some embodiments, for example. The fourth tool is also referred to herein as a metallization system 130 for a semiconductor device and is different than the first, second, and third tools in some embodiments. The semiconductor device in wafer form is placed in the metallization system 130 shown in FIG. 2, and the semiconductor device is affected using the metallization system 130, in accordance with some embodiments.

Referring to FIG. 2, the metallization system 130 includes a mainframe 132. The mainframe 132 comprises a main body of the fourth tool in some embodiments, for example. The metallization system 130 also includes a plurality of modules 134*a*, 134*b*, 134*c*, 134*d*, 134*a'*, 134*b'*, 134*c'*, and 134*d'* disposed proximate the mainframe 132. Each module 134*a*, 134*b*, 134*c*, 134*d*, 134*a'*, 134*b'*, 134*c'*, and 134*d'* comprises a chamber adapted to perform predetermined functions on semiconductor devices processed in the metallization system 130. The metallization system 130 includes two paths 154 and 154' comprising the same types of modules 134*a*, 134*b*, 134*c*, and 134*d*; and 134*a'*, 134*b'*, 134*c'*, and 134*d'*, respectively, so that two or more semiconductor devices can be simultaneously processed. The position of the modules 134*a*, 134*b*, 134*c*, 134*d*, 134*a'*, 134*b'*, 134*c'*, and 134*d'* is shown as an example: the position of the modules 134*a*, 134*b*, 134*c*, 134*d*, 134*a'*, 134*b'*, 134*c'*, and 134*d'* can be intentionally changed or randomly changed relative to one another based upon throughput considerations or other factors, in accordance with some embodiments. For ease of discussion, only path 154 will be described herein.

One of the modules of the metallization system 130 comprises a module 134*a* that is adapted to affect a semiconductor device according to a predetermined productivity requirement and/or a predetermined particular metal scheme requirement, in accordance with some embodiments. For example, in some embodiments, the module 134*a* includes equipment that is adapted to perform a degas process, an atomic layer deposition (ALD) process, a CVD process, an UV exposure process, a plasma or radical pre-cleaning process, a physical vapor deposition (PVD) process, other processes, and/or combinations thereof. In some embodiments of the present disclosure, the module 134*a* includes a PVD module adapted to perform a PVD process. Module 134*a* is also referred to herein as a PVD module, for example.

One of the modules of the metallization system 130 comprises a UV cure module 134*b* in accordance with some embodiments. Steps 108*a*, 108*b*, 110, 112, 116, and/or 120 of the process flow 100 shown in FIG. 1 may be performed in the UV cure module 134*b* in some embodiments, to be described further herein. The UV cure module 134*b* includes a UV light source 136. The UV light source 136 comprises a bulb (e.g., a UV light bulb), wherein the bulb comprises a bulb type of H, H+, D, V, other bulb types, and/or combinations thereof, as examples. The UV cure module 134*b* is adapted to monitor and control the pressure, ambient, and temperature of processes performed in the UV cure module 134*b*, for example, also to be described further herein. The UV cure module 134*b* includes equipment adapted to perform a UV cure process of a material layer of a semiconductor device, for example.

In some embodiments, one of the modules of the metallization system 130 comprises a barrier module 134*c*. The barrier module 134*c* comprises a chamber wherein a metallization layer comprising a barrier layer can be deposited over the semiconductor device, e.g., over the low-K material. The barrier module 134*c* includes equipment adapted to deposit or form a barrier layer on a semiconductor device, for example.

In some embodiments, one of the modules of the metallization system 130 comprises a seed module 134*d*. The seed module 134*d* comprises a chamber wherein a metallization layer comprising a seed layer can be deposited over the semiconductor device, e.g., over the barrier layer in some embodiments. The seed module 134*d* includes equipment adapted to deposit or form a seed layer on a semiconductor device, for example.

The metallization system 130 includes a transport area 138 proximate the mainframe 132 and a load port 140 proximate the transport area 138. The load port 140 includes one or more supports 142 for wafer carriers 144. The transport area 138 includes a robotics device 146 adapted to move a wafer (see wafer 160 in FIG. 3) comprising a semiconductor device from one of the wafer carriers 144 into the mainframe 132. The robotics device 146 is also adapted to move a wafer into a first stage 150 in the mainframe 132. The first stage 150 comprises a vacuum stage in some embodiments, for example. The robotics device 146 is also referred to herein, e.g., in some of the claims, as a first robotics device 146.

The metallization system 130 may also include an interim stage 152 and 152'. Other stages and modules may also be included in the metallization system 130, not shown.

The metallization system 130 further comprises a robotics device 148*a* and/or 148*b* disposed inside the mainframe 132, in some embodiments. The robotics device 148*a* and/or 148*b* is also referred to herein as a second robotics device, e.g., in some of the claims. The robotics device 148*a* and/or 148*b* is adapted to move the wafer from one of modules 134*a*, 134*b*, 134*c*, 134*d*, 134*a'*, 134*b'*, 134*c'*, and 134*d'* and stages 150, 150', 152, and 152' to another one of the modules 134*a*, 134*b*, 134*c*, 134*d*, 134*a'*, 134*b'*, 134*c'*, and 134*d'* and stages 150, 150', 152, and 152'. The interim stages 152 and 152' may comprise holding stages where robotics device 148*a* places a wafer until robotics device 148*b* picks up the wafer, and vice versa in some embodiments, for example. The robotics device 148*a* and/or 148*b* is located in a substantially central region of the mainframe 132 in some embodiments, for example. The robotics device 148*a* and/or 148*b* is disposed within a transfer chamber 149*a* and/or 149*b*, respectively, in some embodiments.

At least some regions of the mainframe 132, at least some of the modules 134a, 134b, 134c, 134d, and the transfer chambers 149a and 149b are maintained in a vacuum to avoid deposited metals from being oxidized during the process flow in some embodiments, for example.

Referring again to FIG. 1, after the semiconductor device is placed in the metallization system 130, the semiconductor device is moved to the UV cure module 134b, and either step 108a or 108b is performed. Step 108a comprises a UV full cure step, in which the low-K material on the semiconductor device is fully cured using a UV cure process. If in the process flow 100, step 102a is performed rather than step 102b, then step 108a is performed to fully cure the low-K material using the UV cure process, because the low-K material has not been partially cured yet. Step 108b comprises a UV partially cure step, in which the low-K material is partially cured. For example, if in the process flow 100, step 102b was performed which includes a UV partial cure, step 108b is performed to complete the curing process and fully cure the low-K material.

One advantage of some embodiments of the present disclosure is that the low-K material is not cured, or is not fully cured before the etch process in step 104, which results in less damage to the value of the dielectric constant or K value of the low-K material.

In some embodiments, the UV full cure step 108a or the UV partial cure step 108b comprise UV full cure or UV partial cure processes that are performed in the UV cure module 134b at a temperature of about 200 degrees C. to about 400 degrees C., in the presence of an ambient gas of He, Ar, or $N_2$, and at a pressure of about 0.1 Torr to about 10 Torr. Alternatively, other processing conditions may be used for the cure steps 108a and 108b.

In some embodiments, after the UV full cure step 108a or UV partial cure step 108b, a K value recovery step 110 is performed. For example, in some embodiments, the etch step 104 and/or ash and clean step 106 damages a surface of the low-K material (e.g., due to carbon depletion) and alters the K value of the low-K material. The bulk k value of the low-K material may be increased by steps 104 and 106 in some embodiments, for example. In some applications, it may be desirable to recover the K value to its initial value or to another value before the etch step 104 and/or ash and clean step 106 process. The K value recovery step 110 is performed in the UV cure module 134b in some embodiments. The UV full cure step 108a may comprise performing a K value recovery process in the UV cure module 134b at a temperature of about 150 degrees C. to about 400 degrees C., in the presence of an ambient gas of He, Ar, $N_2$, or carbon-contained silane, and at a pressure of about 1 Torr to about 100 Torr, as examples. If the ambient gas comprises carbon-contained silane, the carbon-containing silane may comprise a chemical such as $C_xH_ySi$, $C_xH_yO_zSi$, $C_xH_yN_vSi$, $C_xH_yO_zN_vSi$, other chemicals, and/or a combination thereof, as examples. Alternatively, other processing conditions may be used. Processing conditions are selected in some embodiments that return the K value to about its initial value after deposition, in some embodiments, for example.

In some embodiments, the K value recovery step 110 is not included in the process flow 100. For example, in some embodiments, the K value of the low-K material is not altered during the etch, and/or ash and/or clean processes in steps 104 and 106, or the K value is not altered enough to need recovery.

Step 112 comprises a UV degas step 112 in which moisture is removed from the low-K material. The UV degas step 112 results in the removal of moisture or residual gas from the workpiece prior to a PVD deposition in some embodiments, for example. In some embodiments, the UV degas step 112 comprises a UV degas process performed in the UV cure module 134b at a temperature of about 100 degrees C. to about 600 degrees C., in the presence of an ambient gas of Ar, He, $N_2$, $H_2$, $NH_3$, $O_3$, $CO_2$, or $O_2$, and at a pressure of about 0.1 Torr to about 10 Torr, as examples. Alternatively, other processing conditions may be used.

Advantageously, steps 108a, 108b, 110, and 112 may be completed in the same module, e.g., in the UV cure module 134b, in accordance with some embodiments. One or more of steps 108a, 108b, 110, and 112 may be completed without an air break in the UV cure module 134b before the semiconductor device is removed from the UV cure module 134b and moved to the metallization loop (e.g., the barrier module 134c and the seed module 134d).

Next, the semiconductor device is pre-cleaned, using a pre-clean step 114 without UV or using a UV pre-clean step 116. The semiconductor device is pre-cleaned before metallization layers are formed over the low-K material in some embodiments, for example. In some embodiments, the UV pre-clean step 116 may be completed in the same module, e.g., in the UV cure module 134b, as steps 108a, 108b, 110, and 112 are performed. In some applications, less damage is caused by a UV pre-clean process than a non-UV clean process, for example. The UV pre-clean step 116 may be performed using similar processing conditions as described for the UV degas step 112, for example.

In other embodiments, a pre-clean step 114 that does not include UV is performed after the UV degas step 112 rather than the UV pre-clean step 116, in another module other than the UV cure module 134b, such as module 134a in which a plasma or radical pre-cleaning process may be performed in some embodiments, as an example.

In some embodiments, the semiconductor device is then moved by the robotics device 148a and/or 148b to the barrier module 134c. A barrier layer (see barrier layer 174 shown in FIG. 4) is then formed on the semiconductor device over the low-K material in the barrier module 134c in the deposit barrier layer step 118 of the flow chart 100 shown in FIG. 1. The robotics device 148a and/or 148b moves the semiconductor device back to the UV cure module 134b in some embodiments, and step 120 is performed, which comprises a post-barrier UV treatment step 120. For example, in some applications, the barrier layer which may be formed using a CVD or ALD process, as examples, results in the formation of impurities in the barrier layer formed. The post-barrier UV treatment step 120 facilitates in the purification of the barrier layer formed. Advantageously, purifying the barrier layer using a UV treatment does not result in low-K material damage that may result in other types of purification techniques, such as a plasma treatment.

The post barrier UV treatment step 120 may be performed in the UV cure module 134b at a temperature of about 100 degrees C. to about 600 degrees C., in the presence of an ambient gas of Ar, He, $N_2$, $H_2$, $NH_3$, $SiH_4$, or Ne, and at a pressure of about 0.1 Torr to about 10 Torr, as examples. Alternatively, other processing parameters may be used, and the post-barrier UV treatment may be performed in module 134a in embodiments wherein another UV cure module is installed other than UV cure module 134b.

In some embodiments, the semiconductor device is then moved by the robotics device 148a and/or 148b to the seed module 134d. A seed layer (see seed layer 176 in FIG. 4) is formed in the seed module 134d over the barrier layer on the semiconductor device. The seed layer is deposited using PVD in some embodiments, for example. The process flow for the semiconductor device is then continued, to be described further with reference to FIGS. 4 through 6. In some embodiments, at some point in the process flow 100 for the semiconductor device, the semiconductor device is placed into module 134a, and a material layer is formed over the semiconductor device in the module 134a using a PVD process or other process.

Figure 3:
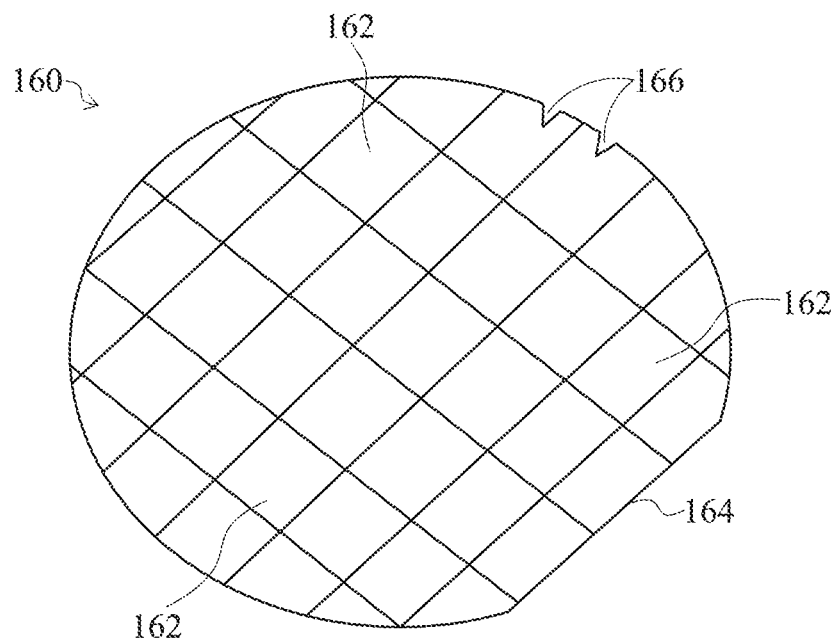
FIG. 3 is a top view of a semiconductor wafer including a plurality of semiconductor devices in accordance with some embodiments.

FIG. 3 is a top view of a semiconductor wafer 160 including a plurality of semiconductor devices 162 in accordance with some embodiments. The semiconductor devices 162 comprise integrated circuits that are arranged in rows and columns. Many semiconductor devices 162 are fabricated on a single wafer 160 and are later singulated to form individual integrated circuits. The wafer 160 may include alignment features such as a flat edge 164 or one or more notches 166 in some applications.

Figure 4:
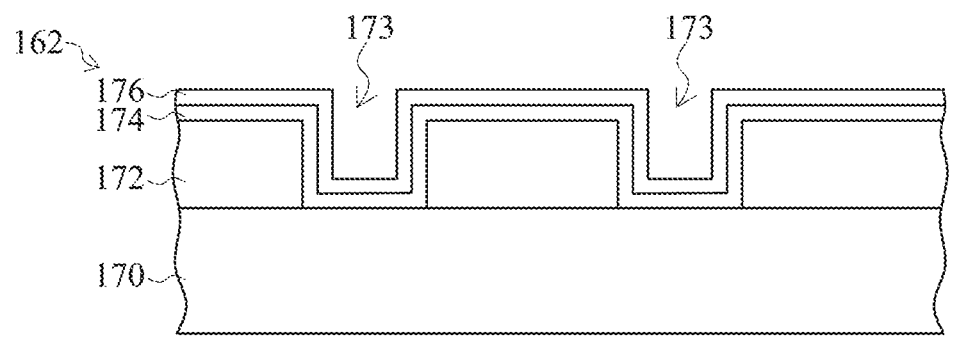
FIGS. 4 through 6 are cross-sectional views of a portion of one of the plurality of semiconductor devices shown in FIG. 3 at various stages of manufacturing in accordance with some embodiments.
Figure 5:
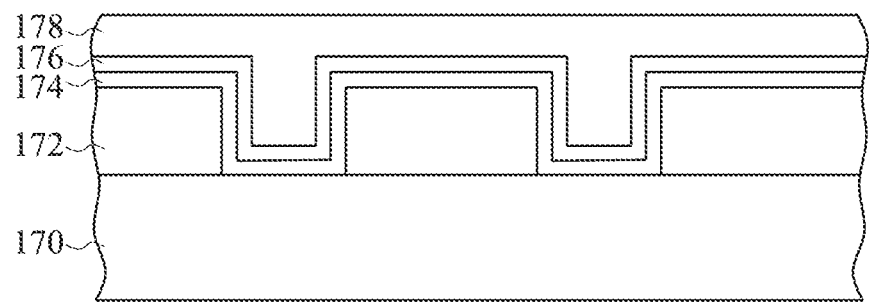
Figure 6:
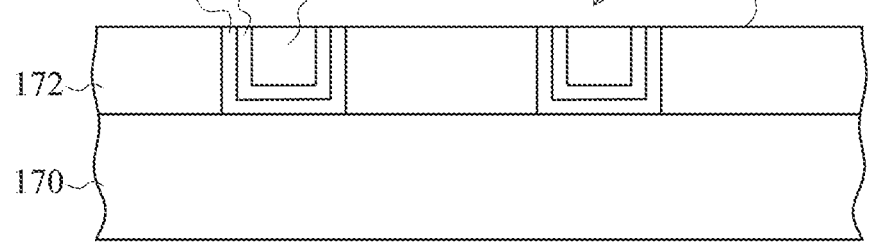

FIGS. 4 through 6 are cross-sectional views of a portion of one of the plurality of semiconductor devices 162 shown in FIG. 3 at various stages of manufacturing in accordance with some embodiments. To manufacture the semiconductor devices 162, a workpiece 170 is provided. The workpiece 170 may include a semiconductor substrate comprising silicon or other semiconductor materials and may be covered by an insulating layer, for example. The workpiece 170 may also include other active components or circuits, not shown. The workpiece 170 may comprise silicon oxide over single-crystal silicon, for example. The workpiece 170 may include other conductive layers or other semiconductor elements, e.g., transistors, diodes, etc. Compound semiconductors, GaAs, InP, Si/Ge, or SiC, as examples, may be used in place of silicon. The workpiece 170 may comprise a silicon-on-insulator (SOI) or a germanium-on-insulator (GOI) substrate, as examples.

A low-K material 172 is deposited or formed over the workpiece 170, as described herein for steps 102a and 102b of the process flow chart 100 of FIG. 1 and as shown in FIG. 4. The low-K material 172 comprises a thickness of about a few nm to several hundred nm or more in some embodiments, as examples. The thickness of the low-K material 172 may vary as a function of a trench or via depth to be formed in the low-K material 172, for example. The low-K material 172 may comprise an insulating material such as $SiO_2$, carbon-doped $SiO_2$, porous carbon-doped $SiO_2$, or other low-K materials, as examples. In embodiments wherein the low-K material 172 comprises $SiO_2$, the low-K material 172 may include a porogen adapted to reduce the k value of the low-K material 172 to a value less than about 3.9, for example. Alternatively, the low-K material 172 may comprise other materials and dimensions. The low-K material 172 is etched (step 104 of FIG. 1) to form trenches in a single damascene process as shown in FIG. 4, or in dual damascene process (not shown) to form openings 173. The low-K material 172 is ashed and cleaned (step 106), and UV fully cured (step 108a) or UV partially cured (step 108b). The K value recovery step 110 may or may not be performed, and the UV degas step 112 is performed. Either the pre-clean step 114 or the UV pre-clean step 116 is then performed.

A barrier layer 174 is deposited (step 118) over the low-K material 172 and exposed portions of the workpiece 170, as shown in FIG. 4. The barrier layer 174 may comprise about 3 Å to about 1,000 Å of a material adapted to prevent diffusion of a subsequently deposited conductive material into the low-K material 172. The barrier layer 174 may comprise Ta, TaN, Ti, TiN, W, WN, $CoSi_x$, MnN, $MnO_xSi_y$, other materials, or multiple layers or combinations thereof, as examples. The barrier layer 174 may be deposited using PVD, CVD, ALD, or other processes, for example. Step 120 comprising the post-barrier UV treatment step 120 is then performed in some embodiments.

The seed layer 176 is then deposited over the barrier layer 174 (step 122 of FIG. 1), also shown in FIG. 4. The seed layer 176 may comprise about 10 Å to about 1,000 Å of a material adapted to facilitate in the formation of a subsequently formed conductive material. The seed layer 176 may comprise copper, a copper alloy, or other materials in some embodiments, as examples.

Referring next to FIG. 5, a conductive material 178 is formed over the seed layer 176 in some embodiments. The conductive material 178 comprises copper or a copper alloy in some embodiments. Alternatively, the conductive material 178 may comprise other materials. The conductive material 178 may be formed by plating, PVD, other methods, or combinations thereof, as examples. In some embodiments, the semiconductor device is moved from the seed module 134d to module 134a, and the conductive material 178 is deposited using a PVD, CVD, or ALD process in module 134a. In other embodiments, the conductive material 178 is deposited in another module of the metallization system 130.

A chemical-mechanical polish (CMP) process and/or etch process is then used to remove the conductive material 178, the seed layer 176, and the barrier layer 174 from over a top surface 180 of the low-K material 172 and form a plurality of conductive features 182 disposed within the low-K material 172, as shown in FIG. 6. The CMP process and/or etch process may be performed in module 134a or another tool or station, as examples.

Advantages of some embodiments of the disclosure include providing novel metallization systems 130 for semiconductor devices that include a UV cure module 134b. The metallization systems 130 advantageously include one or more modules 134a and 134a' and also have UV cure capability that is provided by one or more UV cure modules 134b and 134b'. The metallization systems 130 are versatile, flexible, and capable of multiple purposes. The multi-purpose metallization systems 130 result in a reduced number of tools being required to manufacture semiconductor devices, resulting in a time and cost savings. The metallization systems 130 also allow a flexible chamber arrangement, e.g., the arrangement of the various modules 134a, . . . 134d'.

The low-K material is not cured or is not fully cured before the etch process used to pattern the low-K material, which results in less damage to the K value of the low-K material, because porogens remain in the low-K material during the etch process. Thus, a K value recovery step 110 is not required in some embodiments. In other embodiments, the K value recovery step 110 is facilitated or made easier.

In embodiments wherein a K value recovery step 110 is performed, advantageously, the K value recovery can be performed in the UV cure module 134b in some embodiments, so that there is no air break before moving the semiconductor device into the metallization loop, e.g., into the barrier module 134c and/or the seed module 134d. Air break induced moisture intake and an increase in K value of the low k material is avoided by avoiding an air break before moving the semiconductor device into the metallization loop, for example. Furthermore, the UV degas step 112 and UV pre-clean step 116 can also be performed in the UV cure module 134b in the same chamber, before moving the semiconductor device into the metallization loop.

The post-barrier UV treatment step 120 may be performed in the UV cure module 134b, avoiding a need for a plasma treatment process for the barrier layer, which also avoids or reduces damage to the low-K material. Performing the UV degas step 112 in the UV cure module 134b avoids a need for using a lamp for degassing, which eliminates a need for an additional baking stage and also results in improved moisture removal efficiency, e.g., for the low-K material.

Implementing the UV pre-clean step 116 in the UV cure module 134b results in an ability to eliminate or to not include a separate pre-cleaning chamber in the metallization system 130 in some embodiments, for example. The novel metallization systems 130 described herein comprise flexible chamber configurations for throughput optimization or research and development (R&D) research flexibility. Furthermore, the novel semiconductor device processing methods described herein are easily implementable in manufacturing process flows for semiconductor devices.

Some embodiments of the present disclosure effectively results in the combination of a baking chamber, degas chamber, and pre-clean chamber into one single chamber (e.g., chamber 134a). For example, a UV process for degas and/or pre-cleaning can be performed at a temperature of about 100 degrees C. or greater to remove moisture, similar to a baking process yet without requiring a separate baking chamber or baking step, advantageously. In some embodiments, a method of processing a semiconductor device 162 (see FIG. 4) comprises performing a baking process, a degas process, and a pre-cleaning process on a workpiece 170 in a single chamber or module of a metallization system 130 (see FIG. 2), for example.

In accordance with some embodiments of the present disclosure, a metallization system for semiconductor devices includes a mainframe, and a plurality of modules disposed proximate the mainframe. One of the plurality of modules comprises a PVD module and one of the plurality of modules comprises an UV cure module.

In accordance with other embodiments, a method of processing a semiconductor device includes placing a workpiece in a metallization system, the metallization system including a mainframe and a plurality of modules disposed proximate the mainframe. One of the plurality of modules comprises a PVD module and one of the plurality of modules comprises a UV cure module. The method includes affecting the workpiece using the metallization system.

In accordance with other embodiments, a method of processing a semiconductor device includes forming a low K material over a workpiece, the low-K material having a K value of less than about 3.9. The method includes etching the low-K material, and placing the workpiece in a metallization system. The metallization system includes a PVD module and a UV cure module. The method also includes curing the low-K material in the UV cure module, and pre-cleaning the low-K material.

In one aspect, embodiments described herein may provide for a method including placing in a metallization system a workpiece having formed thereon a low-k dielectric layer, and at least partially curing the low-k dielectric layer in the metallization system using an ultraviolet (UV) light. The method includes depositing a layer on the low-k dielectric layer using a physical vapor deposition (PVD) in the metallization system after at least partially curing the low-k dielectric layer, and curing the low-k dielectric layer using the UV light after depositing the layer.

In another aspect, embodiments described herein may provide for a method including forming a low dielectric constant (K) material over a workpiece, patterning the low-K material, and placing the workpiece in a metallization system. The method includes curing the low-K material in a UV cure module, pre-cleaning the low-K material in the UV cure module, and moving the workpiece to a second module. The method further includes forming a layer over the low-k dielectric material in the second module, and curing the low-K material a second time.

In still another aspect, embodiments described herein may provide for a method including forming on a workpiece a dielectric layer, patterning the dielectric layer, and placing the workpiece in a metallization system. The method further includes partially or fully curing the dielectric layer in a UV cure module of the metallization system, performing a K value recovery process on the dielectric layer after partially or fully curing the dielectric layer, and pre-cleaning the workpiece. The method yet further includes moving the workpiece to second module and therein depositing a barrier layer on the dielectric layer, forming a conductor over the barrier layer, and removing the workpiece from the metallization system.

One general aspect of embodiments described herein includes a method of processing a semiconductor device, the method including: in a first tool, depositing a low-k material on a workpiece; in a second tool, etching the low-k material on the workpiece; in a third tool, performing an ash and clean process on the workpiece; and in a fourth tool having a plurality of modules performing an ultraviolet light cure process on the workpiece in a first module of the plurality of modules; performing a k value recovery process on the workpiece in the first module; removing moisture from the low-k material on the workpiece in the first module; and performing a pre-clean process on the workpiece in the first module.

Another general aspect of embodiments described herein includes a method including: placing a semiconductor device in a metallization system, the semiconductor device including a low-k dielectric layer; in a first module of the metallization system: exposing the low-k dielectric layer to an ultraviolet (UV) light; removing moisture and/or residual gas from the low-k dielectric layer; and pre-cleaning the semiconductor device, where the exposing, the removing, and the pre-cleaning are completed without an air break in the first module; in a second module of the metallization system, depositing a barrier layer on the low-k dielectric layer; in the first module of the metallization system, purifying the barrier layer using a UV treatment; and in a third module of the metallization system, depositing a seed layer on the barrier layer.

Yet another general aspect of embodiments described herein includes a method including: depositing a dielectric layer on a workpiece, etching openings in the dielectric layer, ashing and cleaning the dielectric layer, placing the workpiece in a metallization system, at least partially curing the dielectric layer in a UV cure module of the metallization system, performing a k value recovery process in the UV cure module after the at least partially curing the dielectric layer in the UV cure module, depositing a barrier layer on the dielectric layer in a barrier module of the metallization system, and depositing a seed layer on the barrier layer in a seed module of the metallization system.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of processing a semiconductor device, the method comprising:
   in a first tool, depositing a low-k material on a workpiece;
   in a second tool, etching the low-k material on the workpiece;
   in a third tool, performing an ash and clean process on the workpiece; and
   in a fourth tool having a plurality of modules:
      performing an ultraviolet light cure process on the workpiece in a first module of the plurality of modules;
      performing a K value recovery process on the workpiece in the first module;
      removing moisture from the low-k material on the workpiece in the first module; and
      performing a pre-clean process on the workpiece in the first module.

2. The method of claim 1, further comprising partially curing the low-k material etching the low-k material.

3. The method of claim 1, wherein the ultraviolet light cure process is performed at a temperature of about 200 degrees C. to about 400 degrees C., in the presence of an ambient gas of He, Ar, or $N_2$, and at a pressure of about 0.1 Torr to about 10 Torr.

4. The method of claim 1, wherein the K value recovery process is performed at a temperature of about 150 degrees C. to about 400 degrees C., in the presence of an ambient gas selected from the group consisting of He, Ar, $N_2$, and carbon-containing silane, at a pressure of about 1 Torr to about 100 Torr.

5. The method of claim 4, wherein the carbon-containing silane includes a chemical selected from the group consisting of $C_xH_ySi$, $CH_yO_zSi$, $C_xH_yN_vSi$, $C_xH_yO_zN_vSi$, and combinations thereof.

6. The method of claim 1, wherein the removing of moisture from the low-k material includes subjecting the low-k material to a temperature of about 100 degrees C. to about 600 degrees C., in the presence of an ambient gas of Ar, He, $N_2$, $H_2$, $NH_3$, $O_3$, $CO_2$, or $O_2$, and at a pressure of about 0.1 Torr to about 10 Torr.

7. The method of claim 1, wherein the pre-clean process is an ultraviolet pre-clean process.

8. The method of claim 1, further comprising:
   transporting the workpiece to a second module of the plurality of modules and depositing a barrier layer on the low-k material in the second module.

9. The method of claim 8, further comprising transporting the workpiece to a third module and performing a barrier ultraviolet treatment on the barrier layer.

10. A method comprising:
    placing a semiconductor device in a metallization system, the semiconductor device comprising a low-k dielectric layer;
    in a first module of the metallization system:
       exposing the low-k dielectric layer to an ultraviolet (UV) light;
       removing moisture and/or residual gas from the low-k dielectric layer; and
       pre-cleaning the semiconductor device, wherein the exposing, the removing, and the pre-cleaning are completed without an air break in the first module;
    in a second module of the metallization system, depositing a barrier layer on the low-k dielectric layer;
    in the first module of the metallization system, purifying the barrier layer using a UV treatment; and
    in a third module of the metallization system, depositing a seed layer on the barrier layer.

11. The method of claim 10, wherein the exposing of the low-k dielectric layer to UV light fully cures the low-k dielectric layer.

12. The method of claim 10, further comprising:
    in a third module of the metallization system, depositing a metal on the seed layer.

13. The method of claim 12, further comprising:
    in a fourth module of the metallization system, performing a chemical mechanical polish on the metal.

14. The method of claim 10, wherein the purifying of the barrier layer is performed at a temperature of about 100 degrees C. to about 600 degrees C., in the presence of an ambient gas of Ar, He, $N_2$, $H_2$, $NH_3$, $SiH_4$, or Ne, and at a pressure of about 0.1 Torr to about 10 Torr.

15. The method of claim 10, wherein the exposing of the low-k dielectric layer to an ultraviolet (UV) light is performed at a temperature of about 200 degrees C. to about 400 degrees C., in the presence of an ambient gas of He, Ar, or $N_2$, and at a pressure of about 0.1 Torr to about 10 Torr.

16. The method of claim 10, further comprising exposing the low-k dielectric layer to a K value recovery process performed at a temperature of about 150 degrees C. to about 400 degrees C., in the presence of an ambient gas selected from the group consisting of He, Ar, $N_2$, and carbon-containing silane, at a pressure of about 1 Torr to about 100 Torr.

17. A method comprising:
    depositing a dielectric layer on a workpiece;
    etching openings in the dielectric layer;
    ashing and cleaning the dielectric layer;
    placing the workpiece in a metallization system;
    at least partially curing the dielectric layer in a UV cure module of the metallization system;
    performing a K value recovery process in the UV cure module after the at least partially curing the dielectric layer in the UV cure module;
    depositing a barrier layer on the dielectric layer in a barrier module of the metallization system; and
    depositing a seed layer on the barrier layer in a seed module of the metallization system.

18. The method of claim 17, wherein the at least partially curing of the dielectric layer includes fully curing the dielectric layer.

19. The method of claim 17, further comprising exposing the barrier layer to a UV barrier treatment in the UV cure module.

20. The method of claim 17, further comprising performing a UV pre-clean in the UV cure module before the step of depositing a barrier layer.

* * * * *